United States Patent
Liu

(10) Patent No.: US 11,342,391 B2
(45) Date of Patent: May 24, 2022

(54) FLEXIBLE AMOLED DISPLAY DEVICE

(71) Applicant: Wuhan China Star Optoelectronics Semiconductor Display Technology Co., Ltd., Hubei (CN)

(72) Inventor: Changyu Liu, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 294 days.

(21) Appl. No.: 16/612,581

(22) PCT Filed: Feb. 21, 2019

(86) PCT No.: PCT/CN2019/075637
§ 371 (c)(1),
(2) Date: Nov. 11, 2019

(87) PCT Pub. No.: WO2020/124775
PCT Pub. Date: Jun. 25, 2020

(65) Prior Publication Data
US 2021/0408171 A1 Dec. 30, 2021

(30) Foreign Application Priority Data

Dec. 17, 2018 (CN) .......................... 201811545485.7

(51) Int. Cl.
*H01L 51/00* (2006.01)
*H01L 51/52* (2006.01)
(Continued)

(52) U.S. Cl.
CPC ...... *H01L 27/3234* (2013.01); *G06V 40/1318* (2022.01); *H01L 27/3244* (2013.01);
(Continued)

(58) Field of Classification Search
CPC ............ H01L 27/3234; H01L 27/3244; H01L 27/323; H01L 27/3272; H01L 27/14678;
(Continued)

(56) References Cited

U.S. PATENT DOCUMENTS 9,638,549 B2 * 5/2017 Chen ..................... H01L 23/552
10,417,477 B2 * 9/2019 Ko ..................... H01L 31/02327
(Continued)

FOREIGN PATENT DOCUMENTS

WO WO-2019005498 A1 * 1/2019 ......... G01S 15/8913

*Primary Examiner* — Ida M Soward
(74) *Attorney, Agent, or Firm* — Taft Stettinius & Hollister LLP

(57) ABSTRACT

A flexible AMOLED display device is provided, including an AMOLED screen and an image sensor. The AMOLED screen includes a flexible substrate, a TFT layer, an OLED layer and an encapsulation layer. The flexible substrate includes a fingerprint recognition area and a remaining non-fingerprint recognition area. The image sensor is correspondingly disposed in the fingerprint recognition area of the flexible substrate. The non-fingerprint recognition area of the flexible substrate adopts a dual organic layer structure, including two organic layers and an inorganic spacer layer disposed between the two organic layers. The fingerprint recognition area adopts a single organic layer structure, including only one organic layer. Therefore, the transmittance in the fingerprint recognition area is enhanced, the intensity of light received by the image sensor is increased, and the accuracy of fingerprint recognition is improved. Accordingly, the lifetime of the OLED in the area can be lengthened.

10 Claims, 2 Drawing Sheets

(51) Int. Cl.
  *H01L 27/32* (2006.01)
  *G06V 40/13* (2022.01)
  *H01L 27/146* (2006.01)

(52) U.S. Cl.
  CPC ...... *H01L 51/0097* (2013.01); *H01L 51/5253* (2013.01); *H01L 27/14678* (2013.01); *H01L 27/323* (2013.01); *H01L 27/3272* (2013.01); *H01L 2251/301* (2013.01); *H01L 2251/5338* (2013.01)

(58) Field of Classification Search
  CPC ............. H01L 51/0097; H01L 51/5253; H01L 2251/301; H01L 2251/5338; G06K 9/0004
  See application file for complete search history.

(56) References Cited

U.S. PATENT DOCUMENTS

| | | | | |
|---|---|---|---|---|
| 10,684,650 | B2* | 6/2020 | Sim | G06F 1/1637 |
| 10,685,202 | B2* | 6/2020 | Kim | G02B 6/0088 |
| 10,768,751 | B2* | 9/2020 | Yeke Yazdandoost | G06K 9/00087 |
| 10,839,191 | B2* | 11/2020 | Kim | G06K 9/0004 |
| 10,879,493 | B2* | 12/2020 | Kim | H01L 51/0097 |
| 2011/0109592 | A1* | 5/2011 | Kurokawa | G06F 3/0421 345/175 |
| 2012/0139866 | A1* | 6/2012 | Jung | H01L 27/1222 257/E31.127 |
| 2015/0187980 | A1* | 7/2015 | Yamamoto | H01L 31/125 250/552 |
| 2017/0075475 | A1* | 3/2017 | Miyake | G02F 1/13338 |
| 2017/0124373 | A1* | 5/2017 | Liao | H01L 27/14683 |
| 2017/0221960 | A1* | 8/2017 | Lin | H01L 51/5056 |
| 2017/0287992 | A1* | 10/2017 | Kwak | G06F 1/1686 |
| 2018/0173349 | A1* | 6/2018 | Cho | H01L 51/0097 |
| 2018/0218193 | A1* | 8/2018 | Ding | G06V 10/30 |
| 2018/0239942 | A1* | 8/2018 | Xu | H01L 27/323 |
| 2018/0260602 | A1* | 9/2018 | He | A61B 5/1495 |
| 2018/0268190 | A1* | 9/2018 | Chung | G06V 40/13 |
| 2018/0285619 | A1* | 10/2018 | Kim | G09G 3/3275 |
| 2018/0358401 | A1* | 12/2018 | Lin | H01L 27/14625 |
| 2019/0013368 | A1* | 1/2019 | Chung | H01L 27/30 |
| 2019/0037694 | A1* | 1/2019 | Koo | H05K 1/028 |
| 2019/0065815 | A1* | 2/2019 | Park | H01L 27/288 |
| 2019/0073509 | A1* | 3/2019 | Chien | H01L 27/14623 |
| 2019/0095672 | A1* | 3/2019 | Yeke Yazdandoost | H01L 27/1462 |
| 2019/0114459 | A1* | 4/2019 | Ma | G06V 40/1318 |
| 2019/0129530 | A1* | 5/2019 | Shen | H01L 29/78633 |
| 2019/0130155 | A1* | 5/2019 | Park | G09G 3/32 |
| 2019/0157337 | A1* | 5/2019 | Lin | H01L 27/14625 |
| 2019/0172875 | A1* | 6/2019 | Kang | H01L 27/3234 |
| 2019/0220644 | A1* | 7/2019 | Sun | H01L 51/5253 |
| 2019/0237521 | A1* | 8/2019 | Ju | H01L 27/323 |
| 2019/0239808 | A1* | 8/2019 | Lim | A61B 5/0205 |
| 2019/0280039 | A1* | 9/2019 | Jia | H01L 27/14678 |
| 2019/0340409 | A1* | 11/2019 | Zhu | H01L 27/323 |
| 2019/0361551 | A1* | 11/2019 | Lius | G06F 3/1446 |
| 2020/0133335 | A1* | 4/2020 | Wu | G06V 40/18 |
| 2020/0184246 | A1* | 6/2020 | Fan | G06V 40/1318 |
| 2020/0226344 | A1* | 7/2020 | Wu | G06K 9/00087 |
| 2020/0287161 | A1* | 9/2020 | Kim | H01L 27/326 |
| 2021/0365659 | A1* | 11/2021 | Yang | G02B 27/4205 |

* cited by examiner

FLEXIBLE AMOLED DISPLAY DEVICE

CROSS-REFERENCE TO RELATED APPLICATIONS

This application is a U.S. National Phase of International PCT Application No. PCT/CN2019/075637 filed Feb. 21, 2019, which claims the benefit of Chinese Patent Application Serial No. 201811545485.7 filed Dec. 17, 2018, the contents of each application are incorporated herein by reference in their entirety.

FIELD OF INVENTION

The present invention generally relates to the display technology and, more particularly, to a flexible active-matrix organic light-emitting diode (AMOLED) display device with fingerprint recognition.

BACKGROUND OF INVENTION

The active-matrix organic light-emitting diode (AMOLED) utilizes a type of self-illuminating technology. Compared with the liquid-crystal display (LCD), the self-illuminating AMOLED display does not require a backlight, and has advantages such as fast response, high contrast, wide viewing angle, low power consumption, foldability, light weight, thin thickness, simple structure, low cost, etc., and has thus been considered very likely to become a mainstream display product of the next generation in the industry.

With the development of the display technology, the performance of display devices is getting better and better, which brings forth good visual experiences. However, due to the improvement of life standards, the requirements for display devices are no longer limited to the performance of display, but include a variety of functions. Therefore, flexible display panels with fingerprint recognition are widely used in display screens of electronic devices such as mobile phones, personal digital assistants (PDAs), and computers.

Currently, the fingerprint recognition technologies mainly adopted in the industry includes the capacitive fingerprint recognition technology and the optical fingerprint technology. The capacitive fingerprint recognition technology uses the capacitances between the ridges and the valleys on the fingertip and the sensing electrodes to detect the positions of the ridges and the valleys on the fingertip to thus form the fingerprint image information. The optical fingerprint technology acquires the information of reflected light on the surface of the fingertip through a photosensitive element to finally splice into the complete fingerprint image information. The existing capacitive fingerprint recognition technology requires additional hardware devices such as a tactile switch, a capacitive element, and a fingerprint recognition sensor separately disposed at the fingerprint touch position, which lengthens the processing time and increases the design cost. Moreover, in the existing capacitive fingerprint recognition technology, the fingerprint recognition function is not provided in the display area.

The optical fingerprint technology requires a light source of its own for fingerprint acquisition. Usually, the display screen of the terminal device is used as a light source, such that the fingerprint of the finger is irradiated by the light traveling through the light path. The returned light is returned through the screen to the image sensor under the screen, and the returned image is analyzed and compared to the database by the terminal device to finally recognize the fingerprint. FIG. 1 is a schematic diagram showing the operation of a flexible AMOLED display device with fingerprint recognition. The light emitted by the AMOLED screen 100 irradiates the finger through the film layers therein. After being reflected by the finger, the light passes through the film layers again, and is finally received and recognized by the image sensor 200 disposed under the AMOLED screen 100. Therefore, in order to increase the accuracy of fingerprint recognition, it is necessary to increase the intensity of light received by the image sensor 200, that is, to increase the transmittance of light. Currently in the market, terminal devices such as mobile phones and PAD's having a screen with fingerprint recognition are not provided with any special design on the display screen. Therefore, when the film layers in a terminal device are superimposed, the transmittance of light through the screen is extremely low, resulting in low brightness of light received by the image sensor 200 that lowers the accuracy of fingerprint recognition.

SUMMARY OF INVENTION

One object of the present invention is to provide a flexible AMOLED display device capable of improving the transmittance in a fingerprint recognition area, increasing the intensity of light received by an image sensor, and improving the accuracy of fingerprint recognition.

To achieve the foregoing object, the present invention provides a flexible AMOLED display device including an AMOLED screen and an image sensor disposed on a back side of the AMOLED screen, wherein:

the AMOLED screen includes a flexible substrate and a thin-film transistor (TFT) layer, an OLED layer, and an encapsulation layer sequentially disposed on the flexible substrate;

the flexible substrate includes a fingerprint recognition area and a remaining non-fingerprint recognition area;

the image sensor is correspondingly disposed in the fingerprint recognition area of the flexible substrate;

the non-fingerprint recognition area of the flexible substrate adopts a dual organic layer structure, including a first organic layer adjacent to the TFT layer, a second organic layer away from the TFT layer, and an inorganic spacer layer disposed between the first organic layer and the second organic layer; and the fingerprint recognition area of the flexible substrate adopts a single organic layer structure, including a first organic layer.

In one embodiment, the first organic layer and the second organic layer include at least one of polyimide, polycarbonate, polyethylene, polyethylene terephthalate and polyacrylate, respectively.

In one embodiment, both the first organic layer and the second organic layer include polyimide.

In one embodiment, the second organic layer is thicker than the first organic layer.

In one embodiment, the inorganic spacer layer includes silicon oxide, silicon nitride or silicon oxynitride.

In one embodiment, the inorganic spacer layer includes silicon oxide.

In one embodiment, the flexible AMOLED display device further including a cover plate disposed on a light-emitting surface of the AMOLED screen and a control circuit board electrically connected to the image sensor.

In one embodiment, the encapsulation layer is a thin-film encapsulation layer.

In one embodiment, the OLED layer is a top-emitting OLED structure.

In one embodiment, the non-fingerprint recognition area of the flexible substrate is provided with a light-shielding protective film on one side away from the light-emitting surface of the AMOLED screen.

Beneficial effects of the present invention—the flexible AMOLED display device according to the present invention includes an AMOLED screen and an image sensor. The AMOLED screen includes a flexible substrate, a TFT layer, an OLED layer and an encapsulation layer. The flexible substrate includes a fingerprint recognition area and a remaining non-fingerprint recognition area. The image sensor is correspondingly disposed in the fingerprint recognition area of the flexible substrate. The non-fingerprint recognition area of the flexible substrate adopts a dual organic layer structure, including two organic layers and an inorganic spacer layer disposed between the two organic layers. The fingerprint recognition area adopts a single organic layer structure, including only one organic layer. Therefore, the transmittance in the fingerprint recognition area is enhanced, the intensity of light received by the image sensor is increased, and the accuracy of fingerprint recognition is improved. At the same time, since the transmittance in the fingerprint recognition area is enhanced to lower the intensity of light from the OLED corresponding to the area of the AMOLED screen, the lifetime of the OLED in the area can be lengthened.

For a better understanding of the features and the technical content of the present invention, please refer to the following detailed description and drawings of the present invention. However, the drawings are for reference and description only, and are not intended to limit the present invention.

DESCRIPTION OF DRAWINGS

The technical solutions and other beneficial effects of the present invention will be apparently seen from the detailed description of specific embodiments of the present invention with reference to the accompanying drawings, wherein.

DETAILED DESCRIPTION OF PREFERRED EMBODIMENTS

In order to further clarify the technical means adopted by the present invention and its effects, the following is a detailed description in conjunction with preferred embodiments of the present invention and the accompanying drawings.

Figure 1:
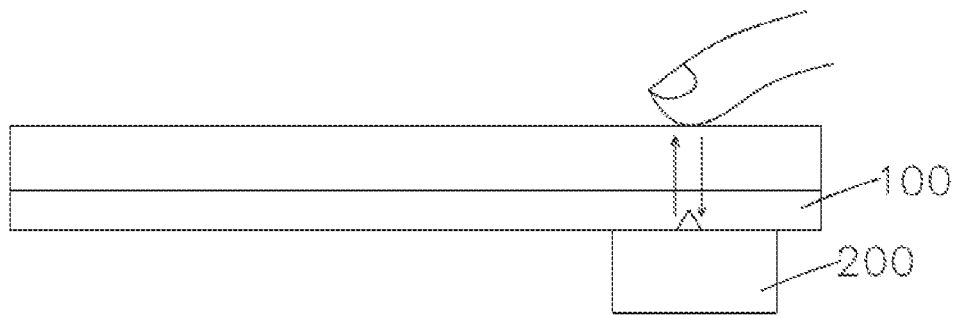
FIG. 1 is a schematic diagram showing the operation of a flexible AMOLED display device with fingerprint recognition.
Figure 2:
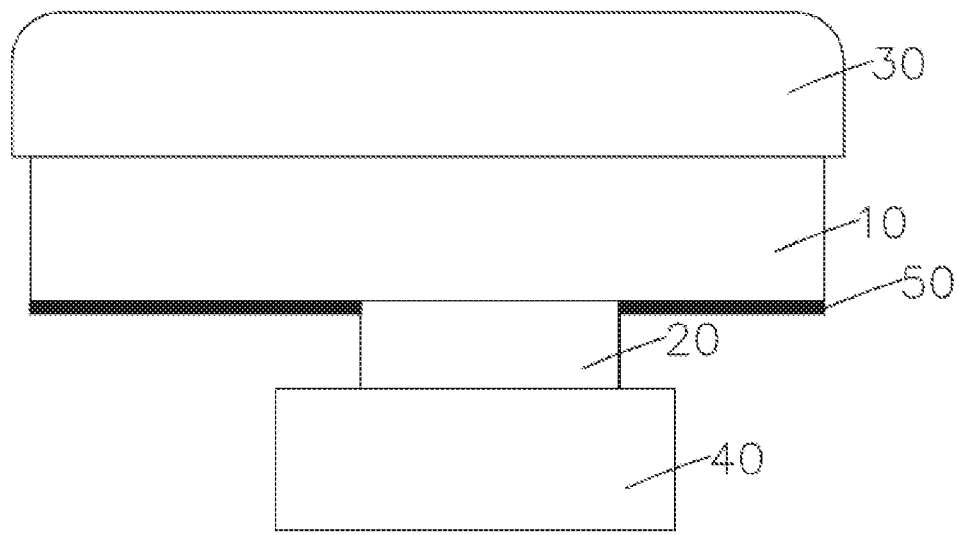
FIG. 2 is a schematic structural view of a flexible AMOLED display device according to the present invention.

Referring to FIG. 2, the present invention provides a flexible AMOLED display device including an AMOLED screen 10, an image sensor 20 disposed on a back side of the AMOLED screen 10, a cover plate 30 disposed on a light-emitting surface of the AMOLED screen 10, and a control circuit board 40 electrically connected to the image sensor 20.

The AMOLED screen 10 includes a flexible substrate 11 and a thin-film transistor (TFT) layer 12, an OLED layer 13, and an encapsulation layer 14 sequentially disposed on the flexible substrate 11.

When a finger presses on the light-emitting surface of the AMOLED screen 10, the light emitted by the OLED layer 13 is reflected by the finger and part of the light passes through the AMOLED screen 10 and reaches the image sensor 20, thereby generating a fingerprint recognition signal.

Figure 3:
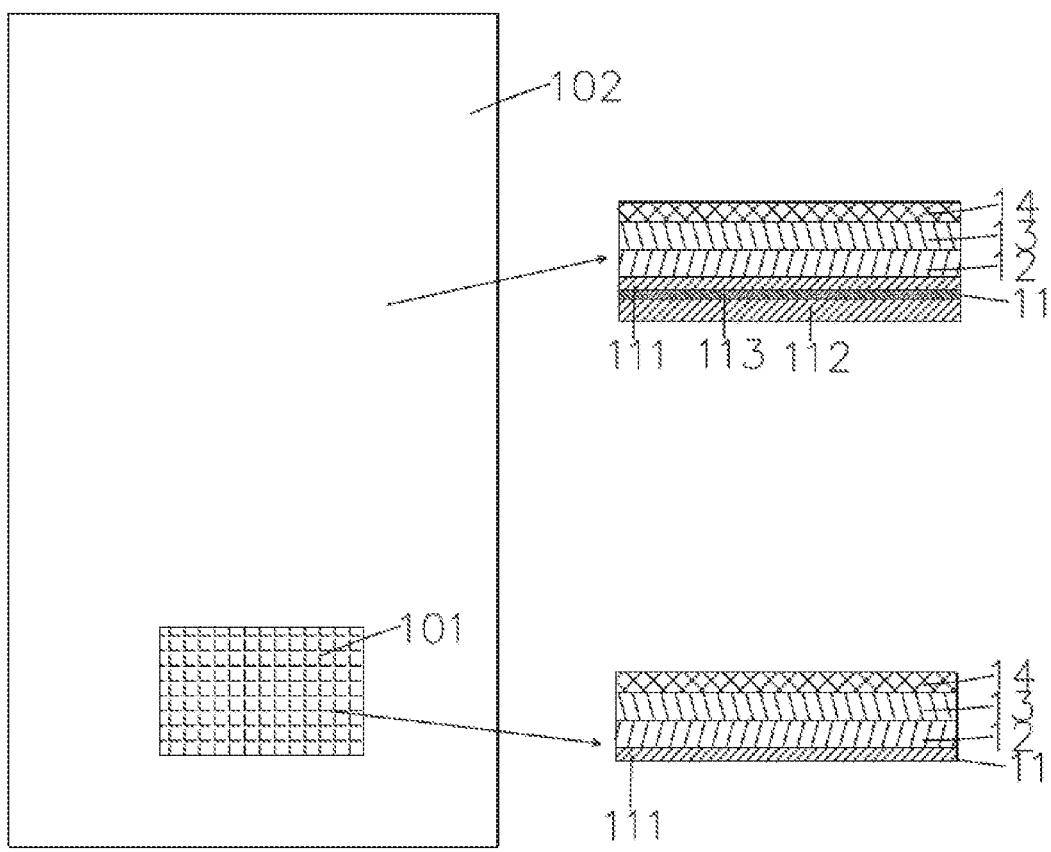
FIG. 3 shows a top view of a flexible AMOLED display device and cross-sectional structural diagrams of an OLED layer in a fingerprint recognition area and a non-fingerprint recognition area according to the present invention.

As shown in FIG. 3, the flexible substrate 11 includes a fingerprint recognition area 101 and a remaining non-fingerprint recognition area 102.

The image sensor 20 is correspondingly disposed in the fingerprint recognition area 101 of the flexible substrate 11.

The non-fingerprint recognition area 102 of the flexible substrate 11 adopts a dual organic layer structure, including two organic layers and an inorganic spacer layer 113 disposed between the two organic layers. The two organic layers are respectively a first organic layer 111 close to the TFT layer 12 and a second organic layer 112 away from the TFT layer 12. The reason that the non-fingerprint recognition area 102 of the flexible substrate 11 adopts a dual organic layer structure is that, first, the toughness and the strength of the flexible substrate 11 can be enhanced, and, second, the water and oxygen barrier capability of the flexible substrate 11 can be improved, thereby lengthening the lifetime of the OLED layer 13.

The fingerprint recognition area 101 of the flexible substrate 11 adopts a single organic layer structure, including an organic layer. The organic layer is a first organic layer 111. That is, the second organic layer 112 and the inorganic spacer layer 113 are hollow in the fingerprint recognition area 101. The image sensor 20 is disposed in the hollow portion. Compared to the non-fingerprint recognition area 102, the thickness of the flexible substrate 11 in the area is thinned, thereby increasing the transmittance in the fingerprint recognition area 101. That is, the intensity of light received by the image sensor 20 is increased and the accuracy of fingerprint recognition is improved. At the same time, since the transmittance in the fingerprint recognition area 101 is enhanced to lower the intensity of light from the OLED corresponding to the area of the AMOLED screen, the lifetime of the OLED in the area can be lengthened.

Specifically, the first organic layer 111 and the second organic layer 112 include at least one of polyimide, polycarbonate, polyethylene, polyethylene terephthalate and polyacrylate, respectively.

Preferably, both the first organic layer 111 and the second organic layer 112 include polyimide.

Specifically, the second organic layer 112 is thicker than the first organic layer 111.

Specifically, the second organic layer 12 is thicker than the first organic layer 11.

Specifically, the inorganic spacer layer 113 includes silicon oxide, silicon nitride or silicon oxynitride.

Preferably, the inorganic spacer layer 113 includes silicon oxide.

Specifically, the encapsulation layer 14 is a thin-film encapsulation layer including an inorganic barrier layer and an organic buffer layer which are alternately stacked.

Specifically, the OLED layer 13 is a top-emitting OLED structure, including a transparent anode layer, an organic functional layer, and a transparent cathode layer disposed in a superposed manner.

Specifically, the non-fingerprint recognition area 102 of the flexible substrate 11 is provided with a light-shielding protective film 50 on one side away from the light-emitting surface of the AMOLED screen 10.

In the flexible AMOLED display device according to the present invention, the non-fingerprint recognition area 102 of the flexible substrate 11 adopts a dual organic layer structure including two organic layers and an inorganic spacer layer 113 disposed between the two organic layers. However, the fingerprint recognition area 101 adopts a single organic layer structure only including an organic layer, which enhances the transmittance in the fingerprint recognition area 101 and increases the intensity of light received by the image sensor 20 to improve the accuracy of fingerprint recognition. At the same time, since the transmittance in the fingerprint recognition area 101 is enhanced to lower the intensity of light from the OLED corresponding to the area of the AMOLED screen 10, the lifetime of the OLED in the area can be lengthened.

In summary, the flexible AMOLED display device according to the present invention includes an AMOLED screen and an image sensor. The AMOLED screen includes a flexible substrate, a TFT layer, an OLED layer and an encapsulation layer. The flexible substrate includes a fingerprint recognition area and a remaining non-fingerprint recognition area. The image sensor is correspondingly disposed in the fingerprint recognition area of the flexible substrate. The non-fingerprint recognition area of the flexible substrate adopts a dual organic layer structure, including two organic layers and an inorganic spacer layer disposed between the two organic layers. The fingerprint recognition area adopts a single organic layer structure, including only one organic layer. Therefore, the transmittance in the fingerprint recognition area is enhanced, the intensity of light received by the image sensor is increased, and the accuracy of fingerprint recognition is improved. At the same time, since the transmittance in the fingerprint recognition area is enhanced to lower the intensity of light from the OLED corresponding to the area of the AMOLED screen, the lifetime of the OLED in the area can be lengthened.

In the above, for those with ordinary skill in the art, various other changes and modifications can be made according to the technical solutions and technical concept of the present invention, and all such changes and modifications are within the scope of the claims of the present invention.

What is claimed is:

1. A flexible active-matrix organic light-emitting diode (AMOLED) display device, comprising an AMOLED screen and an image sensor disposed on a back side of the AMOLED screen, wherein:

the AMOLED screen comprises a flexible substrate and a thin-film transistor (TFT) layer, an OLED layer, and an encapsulation layer sequentially disposed on the flexible substrate;

the flexible substrate comprises a fingerprint recognition area and a remaining non-fingerprint recognition area;

the image sensor is correspondingly disposed in the fingerprint recognition area of the flexible substrate;

the non-fingerprint recognition area of the flexible substrate adopts a dual organic layer structure, comprising a first organic layer adjacent to the TFT layer, a second organic layer away from the TFT layer, and an inorganic spacer layer disposed between the first organic layer and the second organic layer; and the fingerprint recognition area of the flexible substrate adopts a single organic layer structure, comprising a first organic layer.

2. The flexible AMOLED display device of claim 1, wherein the first organic layer and the second organic layer comprise at least one of polyimide, polycarbonate, polyethylene, polyethylene terephthalate and polyacrylate, respectively.

3. The flexible AMOLED display device of claim 2, wherein both the first organic layer and the second organic layer comprise polyimide.

4. The flexible AMOLED display device of claim 1, wherein the second organic layer is thicker than the first organic layer.

5. The flexible AMOLED display device of claim 1, wherein the inorganic spacer layer comprises silicon oxide, silicon nitride or silicon oxynitride.

6. The flexible AMOLED display device of claim 5, wherein the inorganic spacer layer comprises silicon oxide.

7. The flexible AMOLED display device of claim 1, further comprising a cover plate disposed on a light-emitting surface of the AMOLED screen and a control circuit board electrically connected to the image sensor.

8. The flexible AMOLED display device of claim 1, wherein the encapsulation layer is a thin-film encapsulation layer.

9. The flexible AMOLED display device of claim 1, wherein the OLED layer is a top-emitting OLED structure.

10. The flexible AMOLED display device of claim 9, wherein the non-fingerprint recognition area of the flexible substrate is provided with a light-shielding protective film on one side away from the light-emitting surface of the AMOLED screen.

* * * * *